US012733525B2

(12) United States Patent
Kong et al.

(10) Patent No.: US 12,733,525 B2
(45) Date of Patent: Sep. 8, 2026

(54) BUILD UP MATERIAL ARCHITECTURE FOR MICROELECTRONIC PACKAGE DEVICE

(71) Applicant: Intel Corporation, Santa Clara, CA (US)

(72) Inventors: Jieying Kong, Chandler, AZ (US); Peumie Abeyratne Kuragama, Chandler, AZ (US); Ala Omer, Phoenix, AZ (US); Ao Wang, Chandler, AZ (US); Dilan Seneviratne, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 238 days.

(21) Appl. No.: 17/856,780

(22) Filed: Jul. 1, 2022

(65) Prior Publication Data

US 2024/0006296 A1 Jan. 4, 2024

(51) Int. Cl.

*H10W 70/66* (2026.01)
*H10W 70/69* (2026.01)
*H10W 90/00* (2026.01)

(52) U.S. Cl.

CPC ......... *H10W 70/666* (2026.01); *H10W 70/69* (2026.01); *H10W 90/724* (2026.01)

(58) Field of Classification Search

None

See application file for complete search history.

(56) References Cited

U.S. PATENT DOCUMENTS

| | | | | |
|---|---|---|---|---|
| 9,936,581 | B1 * | 4/2018 | Bergman | H05K 3/103 |
| 2020/0105738 | A1 * | 4/2020 | Tseng | H01L 24/13 |
| 2021/0202397 | A1 * | 7/2021 | Kim | H01L 23/13 |

* cited by examiner

*Primary Examiner* — Hung K Vu

(74) *Attorney, Agent, or Firm* — Essential Patents Group, LLP

(57) ABSTRACT

Microelectronic integrated circuit package structures include a first layer over a substrate, the first layer having a matrix material and a filler material within the matrix material. A second layer is on the first layer, the second layer comprising the matrix material or a second material, where the filler material is substantially absent from the second layer. A first portion of a conductive feature is on the second layer and a second portion of the conductive feature is on a sidewall of the first layer.

15 Claims, 18 Drawing Sheets

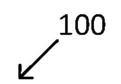
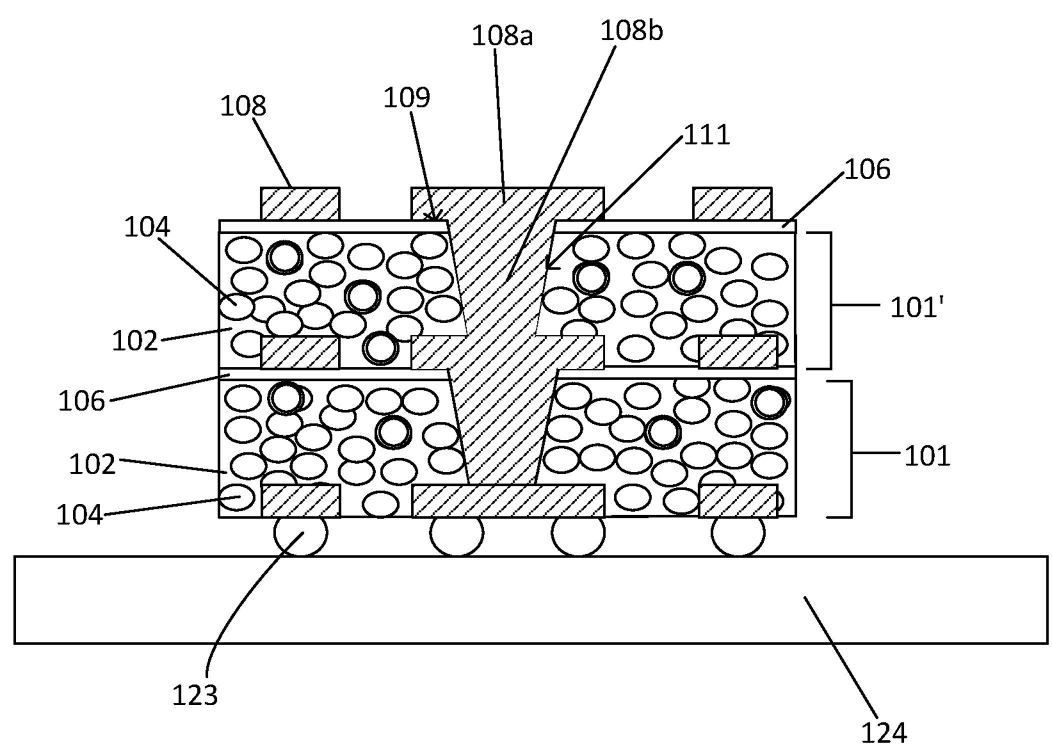
FIG. 1A

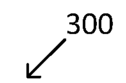
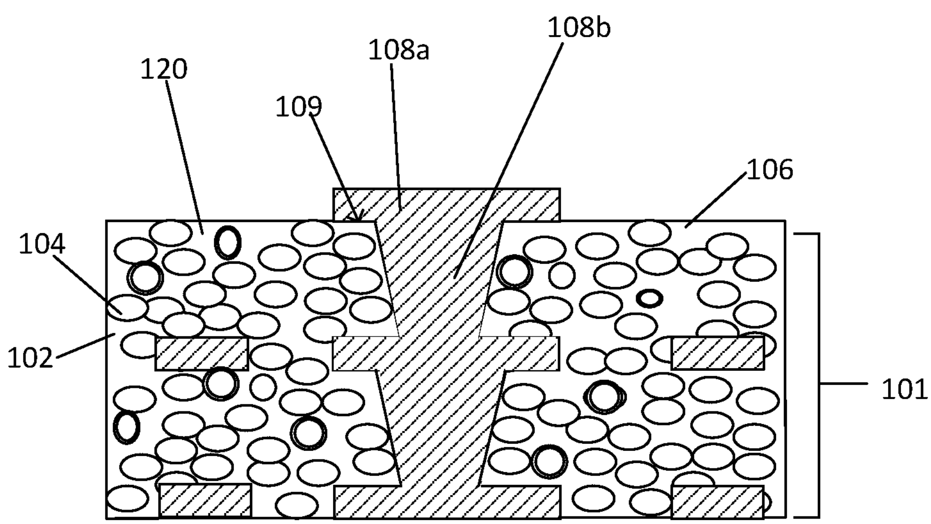
FIG. 3G

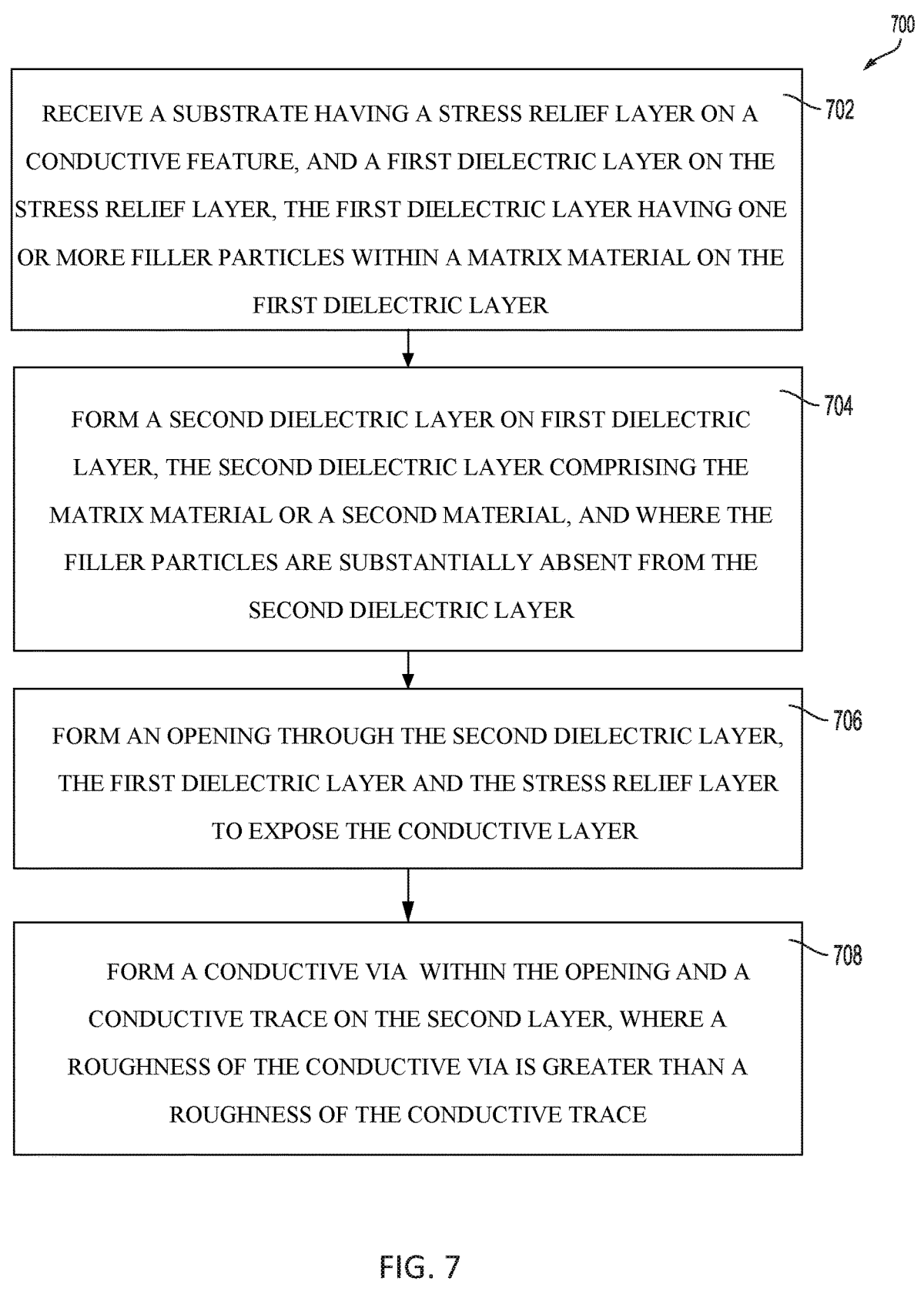

700

RECEIVE A SUBSTRATE HAVING A STRESS RELIEF LAYER ON A CONDUCTIVE FEATURE, AND A FIRST DIELECTRIC LAYER ON THE STRESS RELIEF LAYER, THE FIRST DIELECTRIC LAYER HAVING ONE OR MORE FILLER PARTICLES WITHIN A MATRIX MATERIAL ON THE FIRST DIELECTRIC LAYER — 702

FORM A SECOND DIELECTRIC LAYER ON FIRST DIELECTRIC LAYER, THE SECOND DIELECTRIC LAYER COMPRISING THE MATRIX MATERIAL OR A SECOND MATERIAL, AND WHERE THE FILLER PARTICLES ARE SUBSTANTIALLY ABSENT FROM THE SECOND DIELECTRIC LAYER — 704

FORM AN OPENING THROUGH THE SECOND DIELECTRIC LAYER, THE FIRST DIELECTRIC LAYER AND THE STRESS RELIEF LAYER TO EXPOSE THE CONDUCTIVE LAYER — 706

FORM A CONDUCTIVE VIA WITHIN THE OPENING AND A CONDUCTIVE TRACE ON THE SECOND LAYER, WHERE A ROUGHNESS OF THE CONDUCTIVE VIA IS GREATER THAN A ROUGHNESS OF THE CONDUCTIVE TRACE — 708

FIG. 7

BUILD UP MATERIAL ARCHITECTURE FOR MICROELECTRONIC PACKAGE DEVICE

BACKGROUND

In electronics manufacturing, integrated circuit (IC) packaging is a stage of manufacture where an IC that has been fabricated on a die or chip comprising a semiconducting material is coupled to a supporting case or "package" that can protect the IC from physical damage and support electrical interconnect suitable for further connecting to a host component, such as a printed circuit board (PCB). In the IC industry, the process of fabricating a package is often referred to as packaging, or assembly.

High speed input/output (IO) IC packaged devices currently benefit from insertion loss reduction to maintain or improve their performance. Insertion loss, which can result in signal power loss, can be mitigated by reducing the roughness of conductive traces (such as copper traces) within a device. However, challenges can arise as a result of reduced adhesion between smooth metals and dielectric materials within a package substrate. In some cases, an organic adhesion promotor (OAP) layer may be applied in order to improve the adhesion, but device reliability and performance may be sacrificed due to the OAP leaving gaps between metal traces and the dielectric material. Such gaps can extend further as cracks in the substrate dielectric material, which further reduces reliability and performance of packaged devices.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 1A-1B are cross-sectional views of an IC package structures comprising a bi-layer build up architecture, in accordance with some embodiments.

FIGS. 3A-3K illustrate cross-sectional views of IC package structures formed during the fabrication of bi-layer build up materials, in accordance with some embodiments.

FIG. 7 illustrates a flow chart of a process illustrates a flow chart of a process for the fabrication of IC package structures having bi-layer build up materials, in accordance with some embodiments.

DETAILED DESCRIPTION

Figure 1B:
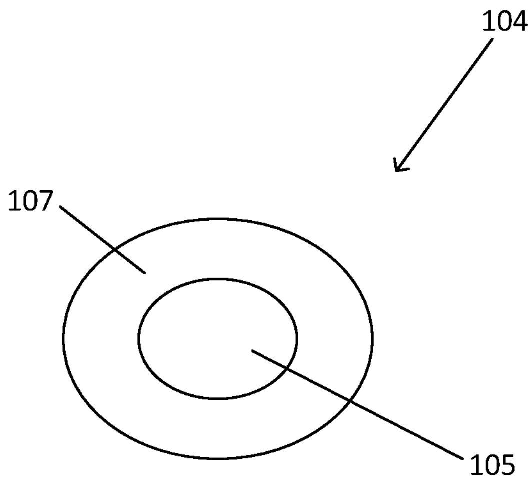

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the explicit context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

The term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

The term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

The term "bond pad" generally refers to metallization structures that terminate integrated traces and vias in integrated circuit packages and dies. The term "solder pad" may be occasionally substituted for "bond pad" and carries the same meaning.

The term "solder bump" generally refers to a solder layer formed on a bond pad. The solder layer typically has a round shape, hence the term "solder bump".

The term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments discussed herein address problems associated with managing adhesion between conductive features and dielectric material within a device substrate. Poor adhesion can result in gap formation between conductive interconnect structures and dielectric material in package substrate structures. A bilayer build up layer can be employed to reduce such gap formation, as will be discussed herein.

Additionally, a conductive polyethylene teraphthalate (PET) film can be used to resolve gap formation and cracking in the dielectric layer of an IC substrate. The conductive PET film enables electrostatic chucking capability during plasma etch processing and serves as surface protection layer to reduce surface over etching risk. Yet another embodiment of the present disclosure concerns the use of a stress relief layer between a conductive trace and the dielectric material of the build up layer of the package substrate. Discussion begins with embodiments related to utilizing a dielectric layer over the dielectric material of the build up layer for reducing the impact of a filler material within the build up layer.

Embodiments herein describe a bi-layer or multi-layer build up material architecture to enable reduced surface roughness of metal traces within the build-up layer. The bi-layer or multi-layer build up package structure enables a reduction in insertion loss for high IO devices utilizing a package substrate according to the build up layer architectures described herein. For example, the build up architecture according to some embodiments herein may include a first dielectric layer over a package substrate. The first layer includes a matrix material and a filler material or particles within the matrix material. As used herein, in the context of matrix and filler composite materials, the terms matrix or matrix material and filler or fill particles are used in accordance with their common usage such that the filler materials are particles added to and dispersed with the bulk matrix material. A second dielectric layer is on the first dielectric layer. The second layer includes the matrix material or a second material, and the filler material is substantially absent from the second layer. As used herein, the term absent from in the context of a material indicates only trace amounts (i.e., less than 0.1% by weight and/or volume) of the material is found. The term fully absent indicates that less than 0.01% by weight and/or volume is in the material. The first and second layer provide an advantageous bi-layer or multi-layer build up material system. A first portion of a conductive feature may be on the second layer and a second portion of the conductive feature may be on a sidewall of the first layer. For example, the first portion may be trace metallization and the second portion may be conductive via.

The first dielectric layer may include a dielectric matrix material of a build up material, such as ABF (Ajinomoto build up film) material, including filler particles. The second dielectric layer may include an organic dielectric layer. In some embodiments, the second dielectric layer is a material layer of the matrix material of the first dielectric layer substantially absent the filler material. In some embodiments, the second dielectric layer is a different material that is also absent the filter material. Notably, in either context, the second layer is absent of or free of the filler material. By forming the second layer on the first layer, the presence of exposed filler material during subsequent processing is advantageously avoided. For example, otherwise exposed filler material would produce gas and/or cracks in the matrix material (i.e., the first layer). Thereby such gap and/or crack formation in the matrix material is avoided, and the reliability and performance of devices incorporating the embodiments include herein is greatly enhanced.

The build up material architectures described herein may be assembled and/or fabricated with one or more of the features or attributes provided in accordance with various embodiments. A number of different assembly and/or fabrication methods may be practiced to generate microelectronic device structures having reduced insertion loss according to one or more of the features or attributes described herein.

FIGS. 1A and 1B illustrate a build up package structure to be utilized for substrates of packaged microelectronic devices, in accordance with some embodiments. The build up architecture includes a dielectric layer over a build up material to be used as a portion of a microelectronic device. The build up architecture enables the reduction of roughness of conductive features and reduces the proliferation of gaps and cracking at conductive interface-dielectric material interfaces within a build up material.

FIG. 1A is a cross-sectional view of a package substrate structure 100, in accordance with some embodiments. In the embodiment depicted in FIG. 1A, package substrate structure 100 includes two first layers 101, 101'. In other embodiments, a single first layer may be used. In some embodiments, more than two first layers 101 may be employed such as three, four, or more. In some embodiments, first layers 101, 101' may be characterized as build up layers 101, 101'. First layers 101, 101' include a matrix material 102 and a plurality of filler material particles 104. In some embodiments, the matrix material 102 is a dielectric material such as an ABF (Ajinomoto build-up film) layer, or other dielectric materials. In some embodiments, the matrix material 102 includes silicon dioxide or other dielectric materials such as an epoxy-polymer blend, silicon nitride, low-k or ultra low-k dielectrics (e.g. having a dielectric constant less than about 3.6), carbon and/or fluorine doped dielectrics, porous dielectrics, or organic polymeric dielectrics, for example.

The filler material 104 may include a plurality of silica particles, which may assist in the prevention of thermal expansion issues, as is understood by those in the art. In some embodiments, filler particles 104 may have a diameter of less than about 3 microns to about 1 micron in size and may have a range of different diameter sizes in some embodiments. For example, filter particles 104 may have an average diameter between 1 to 3 microns. The average diameter may be determined using any suitable technique or techniques such as averaging measured diameters over a sample size that provides a statistically valid sample size such as a sample size of 25 filler particles, 50 filler particles, or 100 filler particles. Although the term diameter is used for the sake of conciseness, the measured value may be a largest width of a filler particle of any suitable cross sectional shape. In some embodiments, filler material 104 may be greater than 50% by volume of first layers 101, 101'. In other embodiments, the filler material 104 may be greater than about 70% by volume. In some embodiments, the filler material 104 may comprise hollow or spherical shapes, or combinations of both, as depicted in FIG. 1B. Filler material 104 may comprise an outer portion 107 and an inner portion 105. In some embodiments the inner portion may be void of any gases, such as air, or may be filled with a gas such as ambient air.

Returning to FIG. 1A, a second layer 106 may be on each of the first layers 101, 101'. Second layer 106 may be an organic dielectric material. In some embodiments, second layer 104 is an organic polymer material that is the same material as matrix material 102. In other embodiments, second layer 106 is a different material than matrix material 102 of first layers 101, 101'. In some embodiments, second layer 106 is advantageously resistant to subsequent chemical processing, such as an etch processing, as will be discussed further herein.

In some embodiments, second layer 106 is a resin material or an epoxy-phenol material. In some embodiments, second layer 106 is free of the filler material 104. In some embodiments, second layer 106 has less than about 0.1% by volume of the filler material 104. In other embodiments, the second layer 106 may be less than about 20 percent by volume. In some embodiments, second layer 106 may has a thickness of between about 1 micron to about 3 microns In an embodiment, conductive features 108 are on or are at least partially within the first layers 101, 101'. In an embodiment, conductive features 108 may comprise a copper conductive feature 108, such that a first portion 108*a* of conductive features 108 is a trace region 108*a* and a second portion 108*b* of conductive features 108 is a via region 108*b*. A portion of trace region 108*a* may be directly on the second layer 106, and a portion of the via region 108*b* may be directly on a sidewall interface 111 of first layer 101'. An interface 109 may be between a portion of trace region 108*a* and a surface of second layer 106. The copper material, for example, of copper trace region 108*a* that is on second layer 106 (i.e., at interface 109) may have a surface roughness of less than about 100 nm when it is directly on the second layer, and may comprise a surface roughness of about of 100-200 nm when the copper of the via region 108*b* is located at the sidewall interface 111. Surface roughness can be measured using white light interferometry and/or atomic force microscopy AFM methodology, as well as by comparing scanning electron microscope (SEM) measurements in the areas of interest.

As shown in FIG. 1A, a microelectronic package substrate 124 may be adjacent first layer 101 and may be mechanically and electrically coupled to first layer 101 by solder balls 123.

Solder balls 123 may include any suitable solder material such as tin, silver, copper, alloys, or alloys of such materials. Substrate 124 may include conductive material with dielectric material interspersed within substrate 124. Substrate 124 may additionally include integrated circuitry fabricated according to any suitable microelectronic technology such as complementary metal oxide semiconductor (CMOS), SiGe, III-V or III-N HEMTs, etc.) techniques or others. For example, substrate 124 may include any number of active or passive devices. In some embodiments, substrate 124 may be an interposer or a PC board in some embodiments.

Figure 2A:
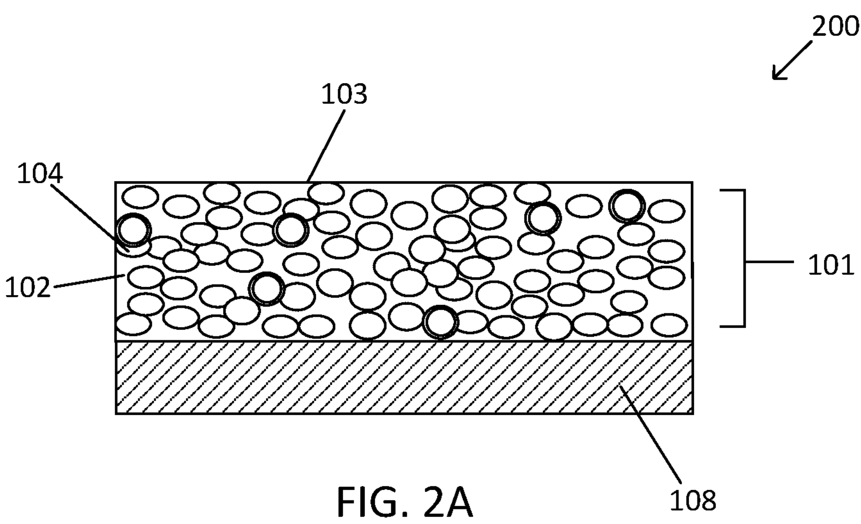
FIGS. 2A-2G illustrate cross-sectional views of structures formed during the fabrication of IC package structures comprising bi-layer build up materials, in accordance with some embodiments.

FIGS. 2A-2G illustrate embodiments of forming an IC package structure (such as the IC package structure of FIG. 1A). FIG. 2A depicts a cross-sectional view of a portion of an IC package structure 200 according to some embodiments. As shown, a conductive layer 108 may be under first layer 101. First layer 101 may be formed/placed on conductive layer 108 using any suitable process as is known in the art, such as lamination techniques, patterning and etch techniques, or the like. As discussed above, first layer 101 includes matrix material 102 and filler materials 104 (or filler particles, fill particles, or fill material). For example, first layer 101 of FIG. 2A may have any characteristics discussed with respect to FIG. 1A and elsewhere herein. In some embodiments, conductive layer 108 is a portion of a package substrate, such as package substrate 124 of FIG. 1A. However, any suitable substrate according to the requirements of the particular application may be deployed in the context of FIG. 1A.

Figure 2B:
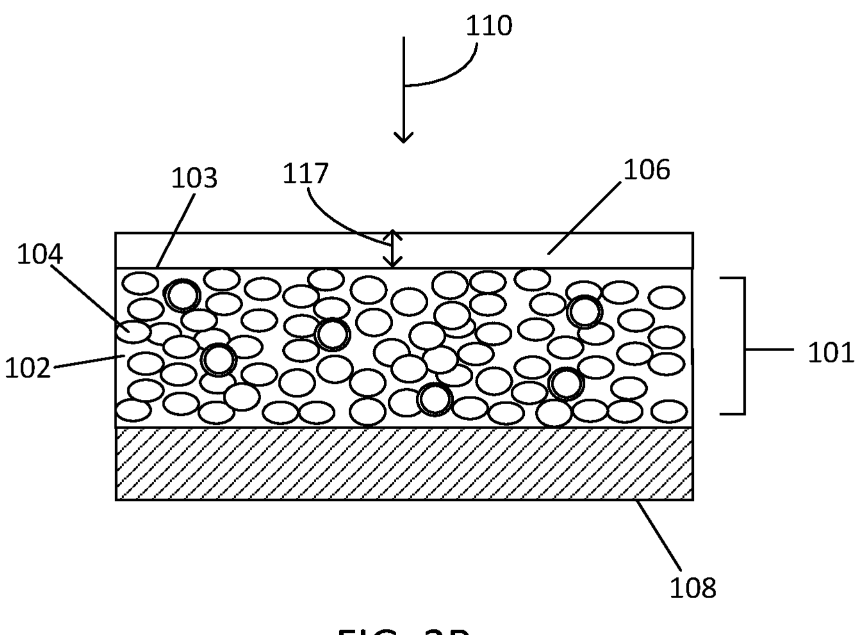

As shown in FIG. 2B, second layer 106 is formed on first layer 101. Second layer 106 may be formed utilizing a formation process 110 on a surface of the first layer 101. In some embodiments, the material of second layer 106 is selected to resist a subsequent chemical etching process, such as a dry etch process, for example. Second layer 106 may include any materials and properties as discussed with respect to FIG. 1A. In some embodiments, second layer 106 is or includes matrix material 102 free of filler particles. Second layer 106 may be formed utilizing any suitable process known in the art, such as a spin on process or a lamination process. Second layer 106 may undergo a curing process and an annealing process, subsequent to lamination onto the surface 103 of the conductive layer 108, for example.

In some embodiments, second layer 106 is an epoxy phenol-based polyimide and/or a benzocyclobutene (BCB) material. In some embodiments second layer 106 is a non-polarizable material, such as fluorinated or olefin based materials. In some embodiments, second layer 106 has a thickness 117 of between about 5 microns to 7 microns, but the thickness 117 may depend upon the particular application.

Figure 2C:
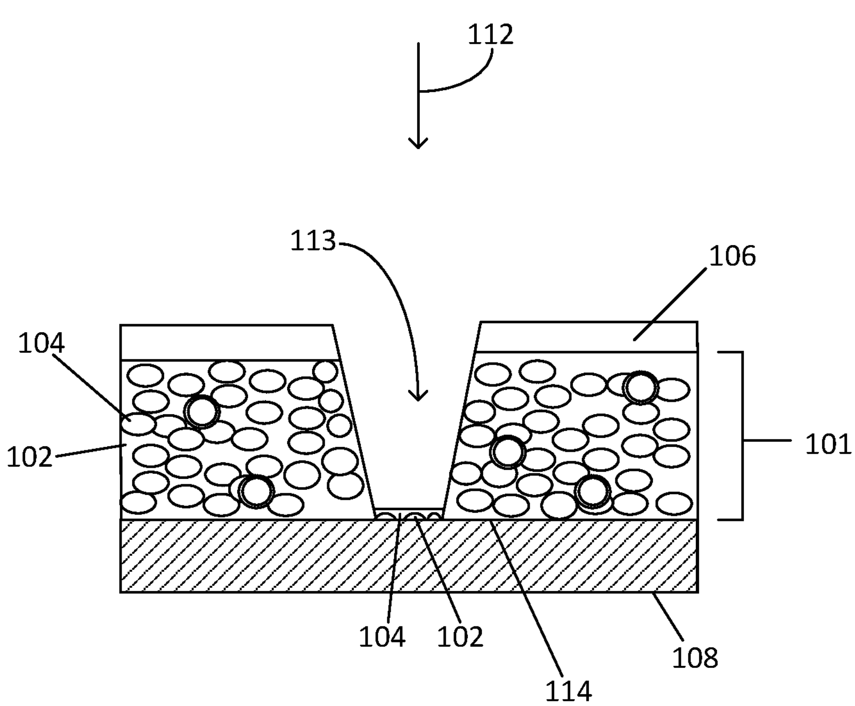
Figure 2D:
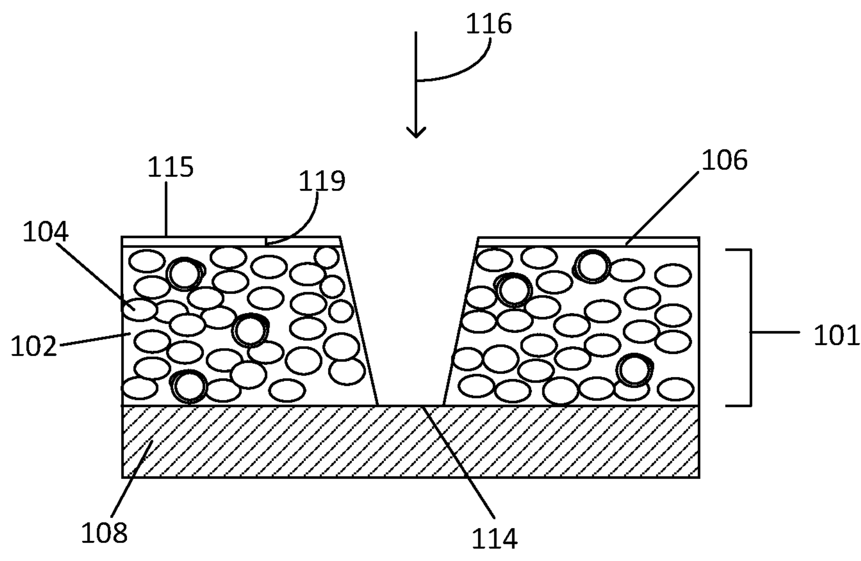

As shown in FIG. 2C, a removal process 112, such as a laser drilling process may be employed to form an opening 113 in second layer 106 and first layer 101 to expose a surface 114 of the underlying conductive layer 108. In some embodiments, opening 113 is characterized as a via opening. Often, after performing removal process 112, such as the laser drilling process, there may be an amount of residue remaining on surface 114 of conductive layer 108 (shown as residual matrix material 102 and residual filler material 104). Consequently, an additional removal process 116 may be performed as shown in FIG. 2D. In an embodiment, additional removal process 116 is a dry etch process that is applied to further clean surface 114 of conductive layer 108.

In some embodiments, removal process 116 is a de-smear process. For example, removal process 116 may be optimized such that a surface 115 of second layer 106 and the residue on the surface of the conductive layer 116 may be removed at the same time. Thus, thickness 119 of second layer 108 after removal process 116 may be reduced. In an embodiment, thickness 119 of etched second layer 106 is between about 500 nm and about 1.5 microns.

Figure 2E:
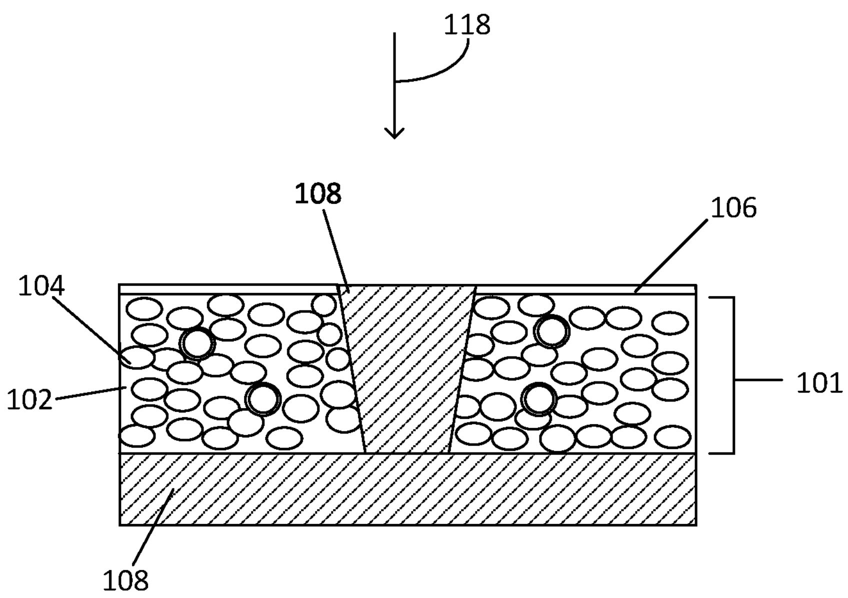

As shown in FIG. 2E, a formation process 118, such as an electroless plating process, may be performed to provide conductive material 108 in opening 113. Formation process 118 may be any suitable formation process, such as a wet electroless process or a dry electroless sputtering process. Conductive material formed in opening 113 may comprise be any material and/or have any characteristics as discussed with respect to FIG. 1A.

Figure 2F:
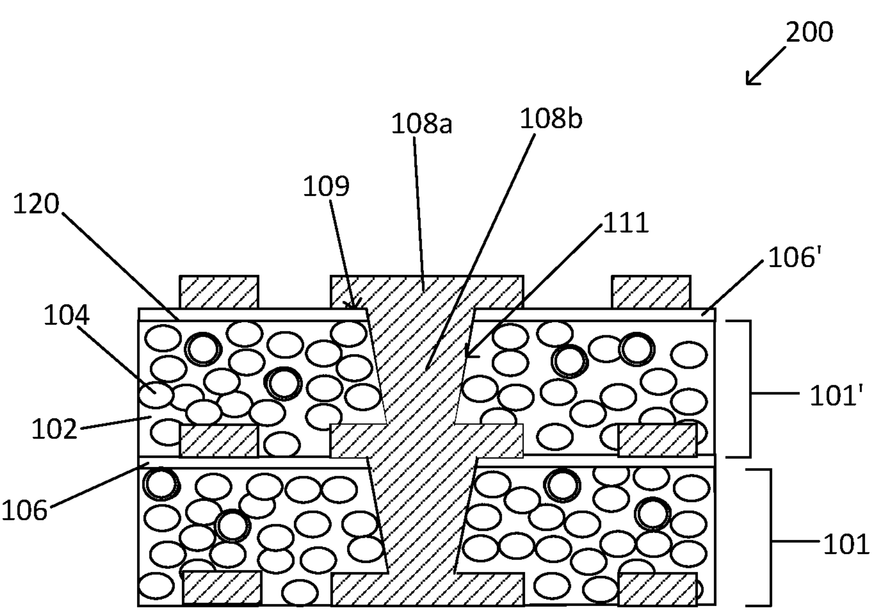

FIG. 2F depicts an IC package structure 200 wherein two first layers 101, 101' are formed. First layers 101, 101' are separated from each other by a second layer 106. An additional second layer 106' is on a surface 120 of the first layer 101'. There are several benefits of using the second layer 106 during removal processes 122, 116 of FIGS. 2D and 2E respectively. For example, second layer 106 enables a relatively low surface roughness of the conductive material 108 at the interface location 109. Without second layer 106, first layer 101 would have exposed filler particles which could lead to a higher conductor material roughness.

Figure 2G:
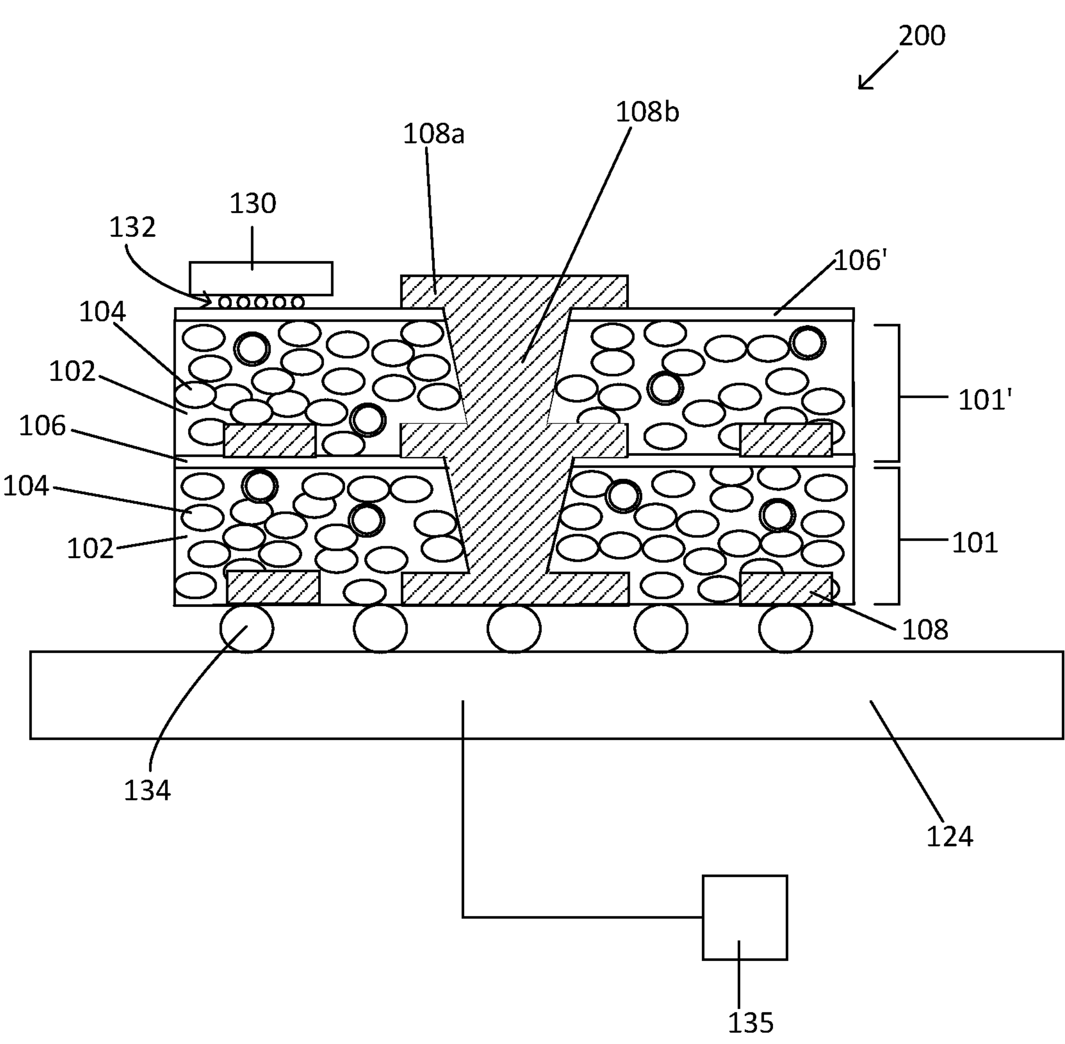

As shown in FIG. 2G, die 130 may be coupled to second layer 106', and a substrate 124 may be coupled to first layer 101, on a side opposite the die 130. Die 130 may be any appropriate die/device, including, but not limited to, a microprocessor, a chipset, a graphics device, a wireless device, a memory device, an application specific integrated circuit, a transceiver device, an input/output device, combinations thereof, stacks thereof, or the like.

Die 130 is electrically coupled to IC package structure 200 through conductive interconnect structures 132. As used herein, the term conductive interconnect structure indicates any structure or conductive element for coupling to an outside die or other device. In an embodiment, conductive interconnect structures 132 include a solder structure. For example, conductive interconnect structures 132 may be solder balls. As used herein, the term solder balls indicates an interconnect structure prior to or after reflow. Solder structures 132 may include one or more of silver, tin, or copper, or combinations or alloys thereof. Substrate 124 may be any suitable substrate such as an interposer or a board, for example, and may be coupled to IC package structure 200 through conductive interconnect structures 134. A power supply 135, which may comprise any suitable power supply as known in the art, may be coupled to die 130 via IC package structure 200, in an embodiment.

Also, second layer 106 enables a wafer (e.g., a wafer comprising the IC package structure 200) or a panel level substrate to become more stable on a plasma processing tool wafer platform. An electrostatic chucking (ESC) function in a plasma etching chamber is theoretically dependent on material insulating properties and surface profile. Exposed filler material on the surface of such a wafer (which may be present without second layer 106) could significantly reduce the chucking force. With second layer 106 providing etch protection for underlying first layer 101, the risk of filler exposure is reduced, and therefore device yield and throughput may be increased.

Figure 3A:
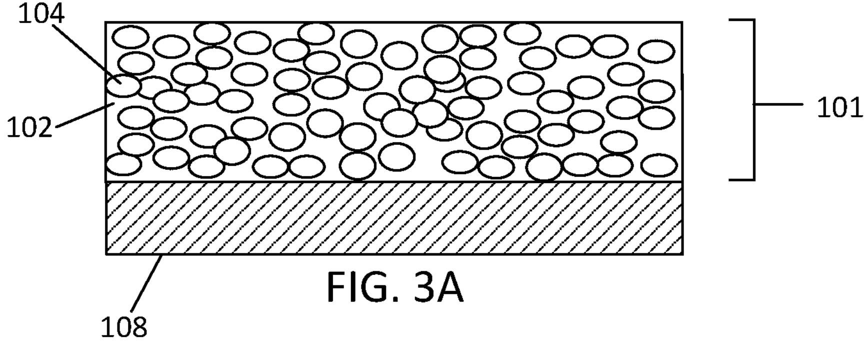

FIGS. 3A-3K illustrate another embodiment of forming an IC package structure according to some embodiments. FIG. 3A depicts a cross-sectional view of a portion of an IC package structure according to some embodiments herein. Conductive layer 108 is under first layer 101. First layer 101 may be formed/placed on the conductive layer 108 using any suitable process as is known in the art, such as lamination. First layer 101 may include matrix material 102 and material 104 as discussed with respect to FIG. 1A. In some embodiments, conductive layer 108 is a portion of a package substrate, such as package substrate 124 of FIG. 1A. However, any suitable substrate may be deployed according to the requirements of the particular application.

Figure 3B:
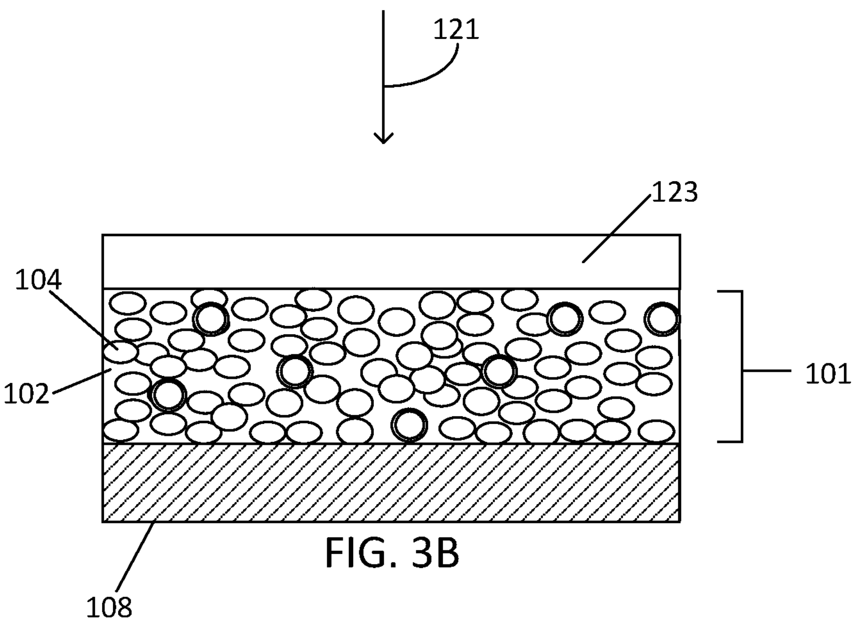

As shown in FIG. 3B, second layer 123 is placed/formed utilizing formation process 121 on a surface of first layer 108. In some embodiments, second layer 123 is laminated onto the first layer 101 and then cured and annealed. Second layer 123 may be selected to resist a subsequent chemical etching process, such as a dry etch process, for example. In some embodiments, second layer 123 is a conductive polyethylene teraphthalate (PET) material In an embodiment, a resistivity of the PET material may be below about $10^{12}$ ohms.

Figure 3C:
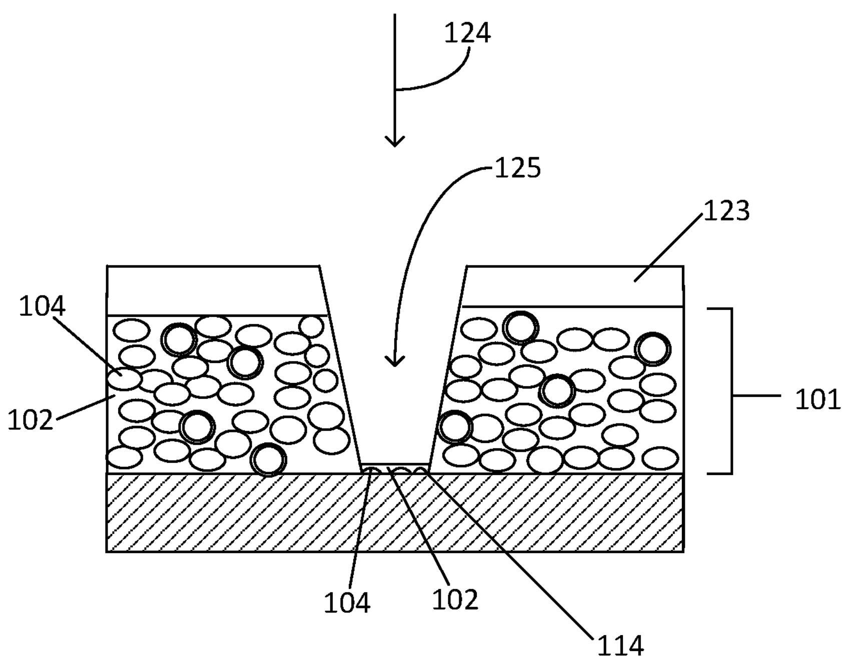
Figure 3D:
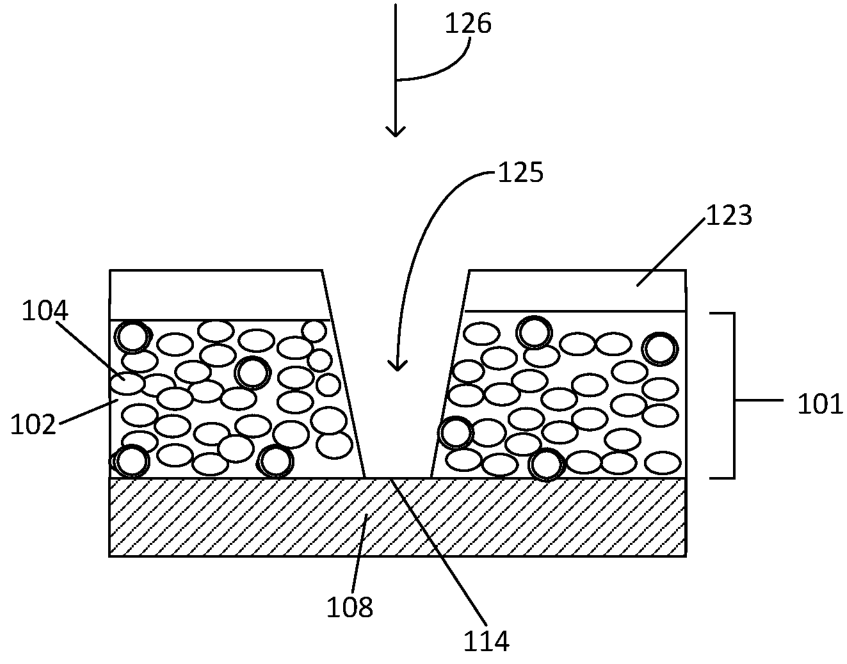
Figure 3E:
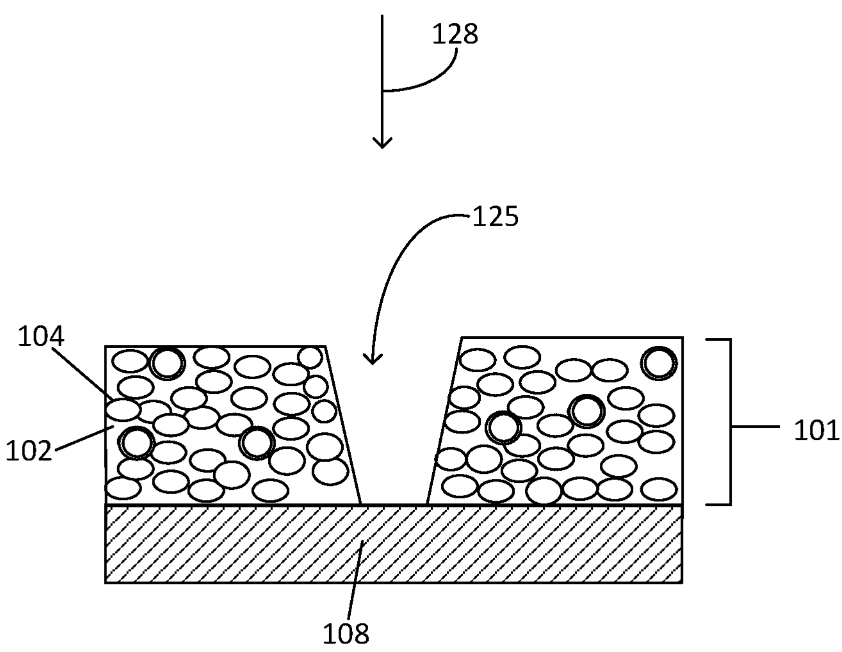

In FIG. 3C, a removal process 124, such as a laser drilling process is employed to form an opening 125 in second layer 123 and first layer 101 to expose surface 114 of the underlying conductive layer 108. In some embodiments, opening 125 may provide a via opening. Additional removal process 116, as shown in FIG. 3D, may be performed to remove residual first layer 101 material at the surface 114 of the conductive layer 108. In some embodiments, removal process 116 may be a dry etch process, as is known in the art, which may be applied to further clean surface 114 of conductive layer 108. Second layer 123 (e.g., a PET layer) 123 may then be removed utilizing a removal process 128 as shown in FIG. 3E. The PET layer may be removed using any suitable technique or techniques.

Figure 3F:
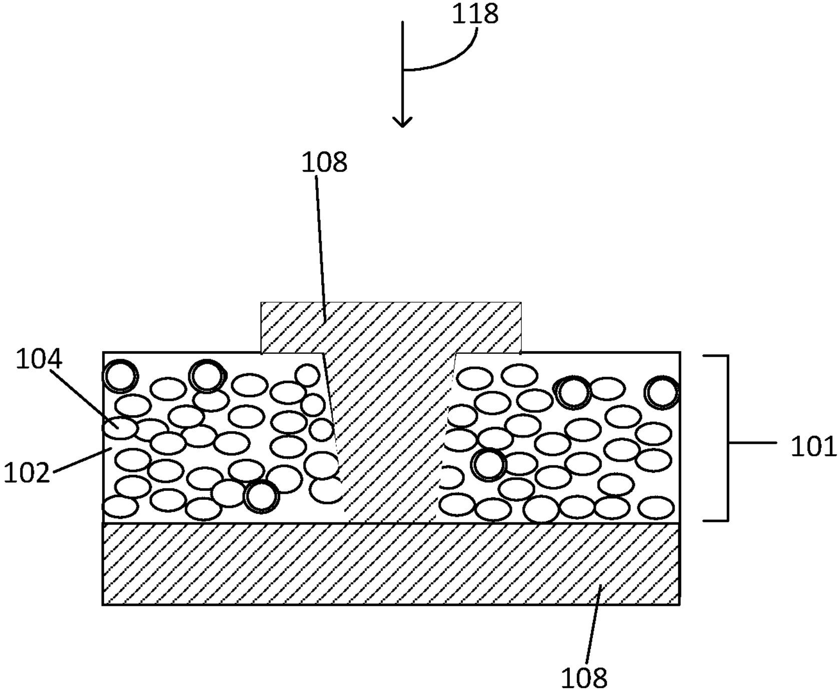

FIG. 3F depicts a formation process 118, such as an electroless plating process, that may be performed to fill opening 125 with conductive layer 108. As shown, a portion of conductive layer 108 is within opening 125 and on sidewalls of first layer 101 and a second portion of conductive layer 108 is on a top surface of first layer 101. FIG. 3G depicts a portion of an IC package structure 300 subsequent to the deposition and patterning of metal layers. The conductive PET layer 123 enables a reduction in roughness of conductive material (such as copper, for example) at the interface location 109, since the PET layer 123 may function as an etch stop during the dry etch de-smear process. Non-conductive PET resistivity is usually in the $10^{15}$ Ohm range, but by utilizing a conductive PET layer 123 (which may be doped to reduce its resistivity to below about $10^{12}$ ohm), the PET layer 123 can also be used as a chucking film for panel handling during plasma etching processes.

Figure 3H:
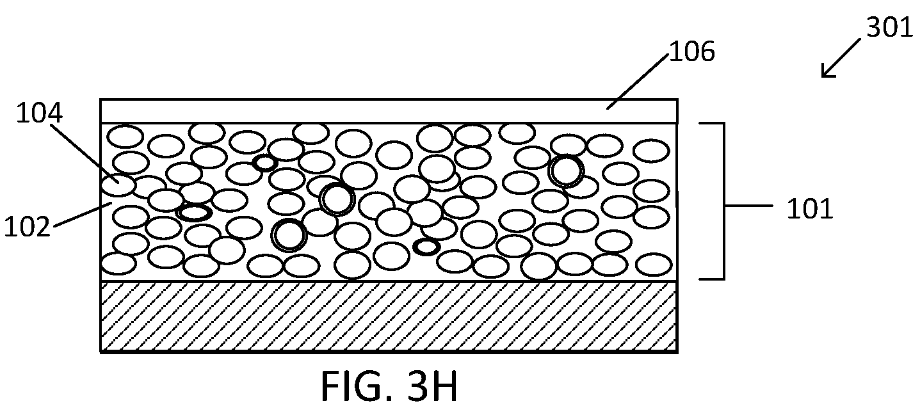
Figure 3I:
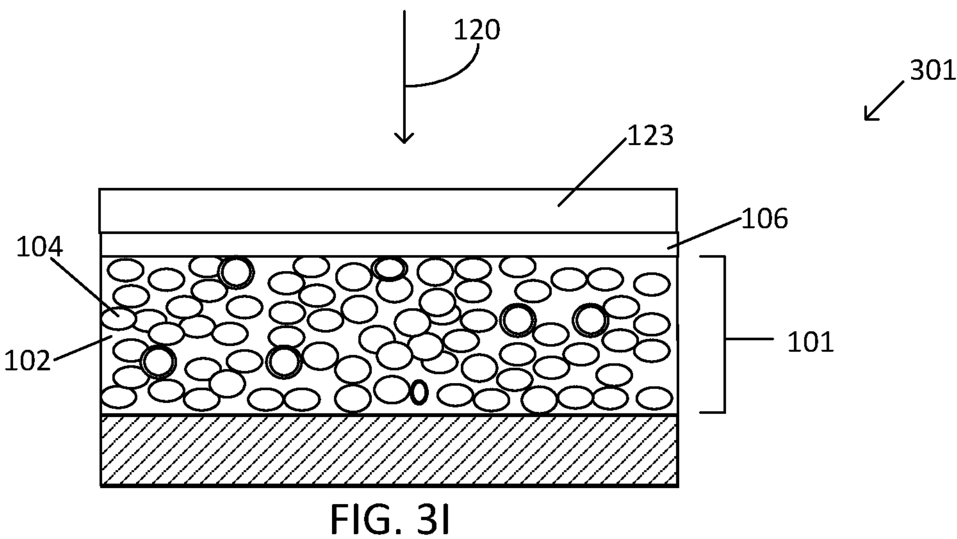
Figure 3J:
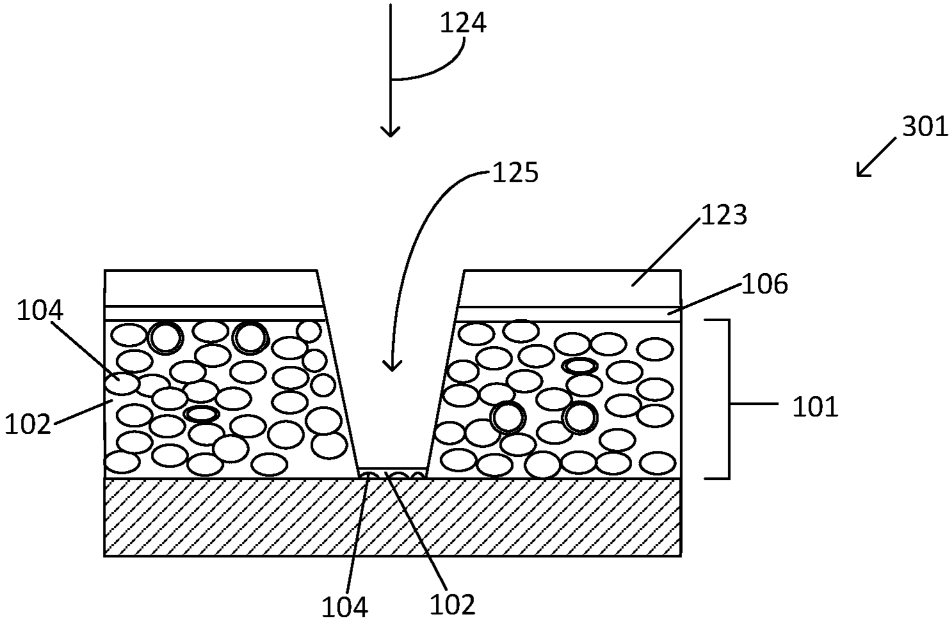
Figure 3K:
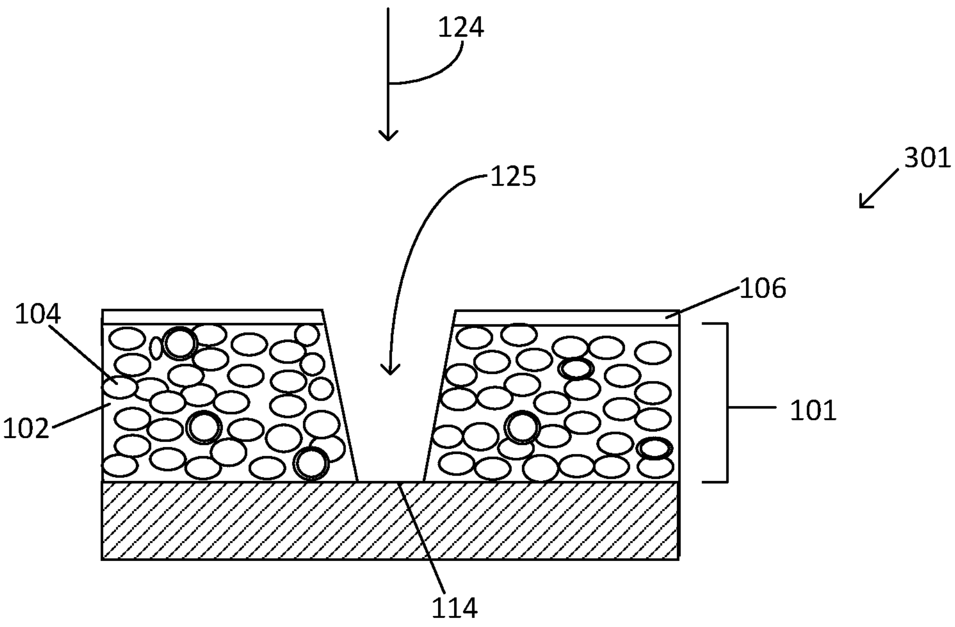

In another embodiment, as shown in FIGS. 3H-3K, an incoming substrate/workpiece 301 may comprise first layer 101 under second layer 106 (similar to first and second layers 101, 106 of FIG. 2B or 2E, for example), as shown in FIG. 3H. FIG. 3I illustrates the PET material may be a third layer 123 formed/placed on second layer 106. Subsequently as shown in FIGS. 3J and 3K, opening 125 is formed through the third, second and first layers 123, 106, 101 to expose at least a portion of the underlying conductive layer 108, the PET layer 123 is then removed. The workpiece 301 may then be processed in accordance with FIGS. 2E-2G.

Figure 4A:
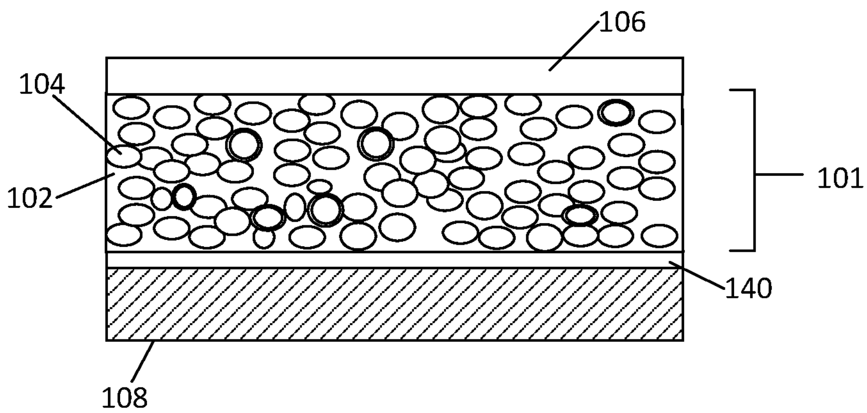
FIGS. 4A-4D illustrate cross-sectional views of IC package structures formed during the fabrication of bi-layer build up materials, in accordance with some embodiments.

In another embodiment, as shown in FIGS. 4A-4D, a stress relief layer 140 may be on the conductive layer 108, such that stress relief layer 140 is between first layer 101 and conductive layer 108. As also shown in FIG. 4A, second layer 106 is on first layer 101. In some embodiments, a third layer 123 may be on the second layer 106 (such as is shown in FIG. 3J, for example). Stress relief layer 140 is an organic film, in some embodiments. In some embodiments, stress relief layer 140 is a dielectric adhesive or dielectric adhesion layer. In some embodiments, stress relief layer 140 is one of an epoxy, a polyimide, a maleimide, or any other organic material that may provide a stress buffer dielectric, and comprises a thickness of between x and y (please add).

Figure 4B:
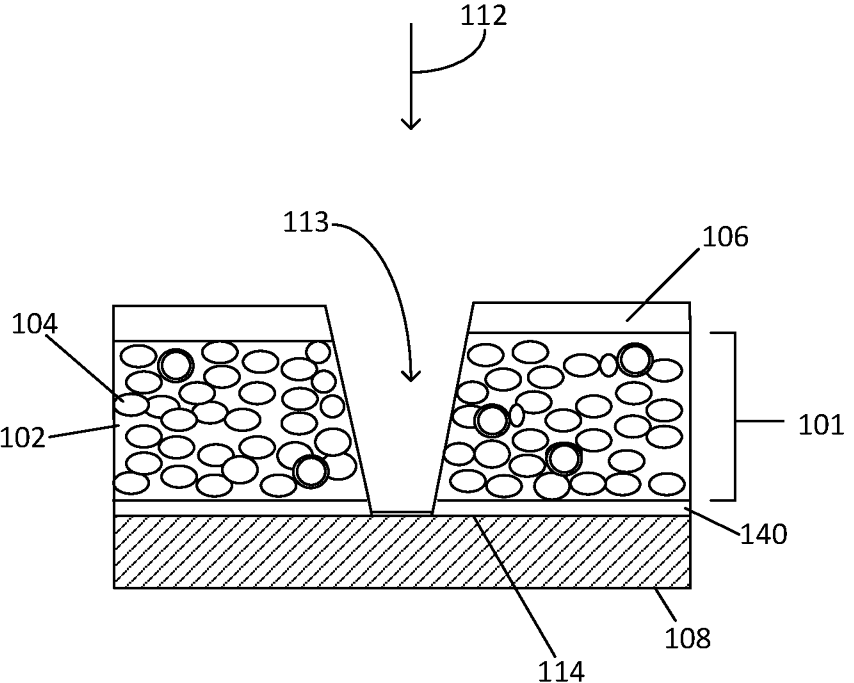
Figure 4C:
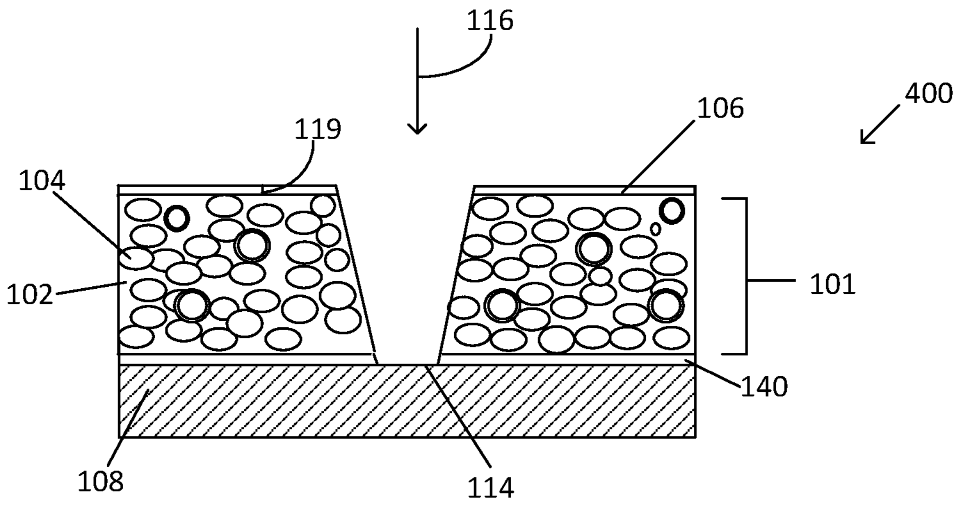
Figure 4D:
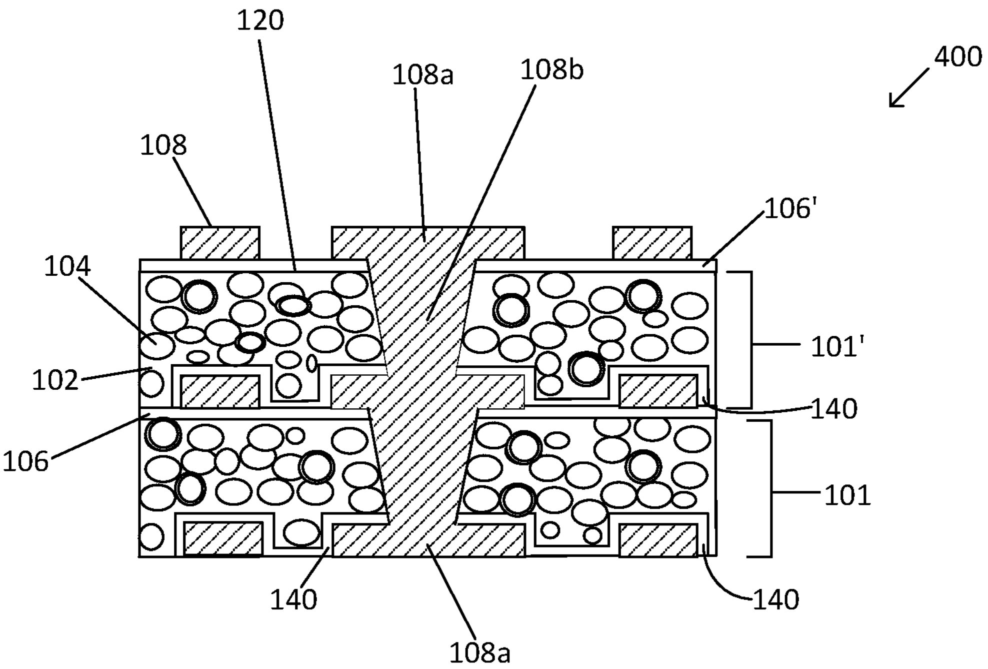

For example, stress relief layer 140 promotes adhesion between first layer 101 and conductive layer 108. Furthermore, stress relief layer 140 can absorb stress around a via or trace structure to reduce the likelihood of failure due to delamination. FIGS. 4B-4D depict formation of a portion of an IC package structure 400 comprising stress relief layer 140 according to some embodiments. In FIG. 4B, removal process 112, such as a laser drilling process may be employed to form an opening 113 in the second layer 106, the first layer 101 and the stress relief layer 140 to expose a surface 114 of the underlying conductive layer 108. In FIG. 4C, de-smear process 116 may be utilized to remove residual stress relief layer 140 material from the surface 114 of the conductive layer 108.

In FIG. 4D, subsequent to multiple build up layer formation processes according to the embodiments herein, an IC package structure 400 is shown comprising two first layers 101, 101'. The first layers 101, 101' are separated from each other by a second layer 106. An additional second layer 106' is on a surface 120 of the first layer 101'. The stress relief layer 140 is between the first layers 101, 101' and the conductive layer 108 trace portions.

Discussion now turns to operations for assembling and/or fabricating the discussed structures.

Figure 5:
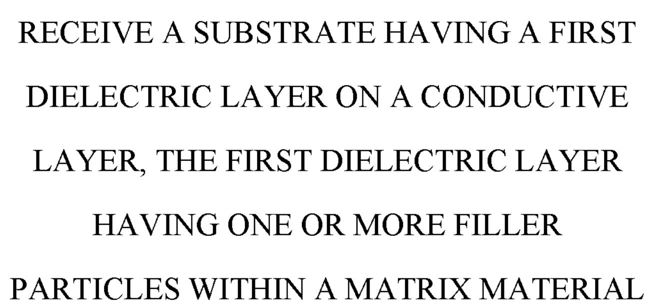
FIG. 5 illustrates a flow chart of a process for the fabrication of IC package structures having bi-layer build up materials, in accordance with some embodiments.

FIG. 5 is a flow chart of a process 500 of fabricating a microelectronic IC package structure according to some embodiments. For example, process 500 may be used to fabricate any of the microelectronic IC package structures of FIGS. 2A-2G.

As set forth in block 502, a substrate, such as a package substrate, is received having a first dielectric layer on a conductive layer, the first dielectric layer having one or more filler particles within a matrix material. The package substrate may be any substrate discussed herein having any number and layout of interconnect structures (e.g., solder balls). For example, one or more conductive interconnect structures may be formed on a surface of a substrate. The substrate may further include substrate pads and solder balls on each individual substrate pad. In some embodiments, the conductive layer may comprise a copper layer which is to be subsequently patterned.

As set forth in block 504, a second dielectric layer may be formed on the first dielectric layer, the second dielectric layer comprising the matrix material or a second material. For example, the matrix material of the first dielectric layer may comprise a phenol-based polyimide (PBO), while the second dielectric layer may comprise a BCB, or vice versa. In other embodiments, the matrix material and the second dielectric layer material may be substantially identical. The filler material is substantially absent from the second dielectric layer. The filler material may comprise silica particles, which may be hollow in some embodiments, as depicted in FIG. 1B. For example, the first dielectric layer may comprise greater than 70 percent filler material, while the second dielectric material may comprise less than 0.1 percent filler material.

As set forth in block 506, an opening may be formed through the second dielectric layer and the first dielectric layer to expose the conductive layer. In an embodiment, the opening may comprise a via opening. As set forth in block 508, a conductive material, such as copper for example, may be formed in the via using electroless formation processing, as is known in the art. A conductive trace may be formed on the via as well as on a portion of the second layer adjacent the via. The trace material may comprise a lower degree of roughness due to the presence of the second layer. The second layer prevents filler material from being exposed during the formation of the conductive trace, and thus reduces the amount of roughness of the conductive trace, which improves device performance.

Figure 6:
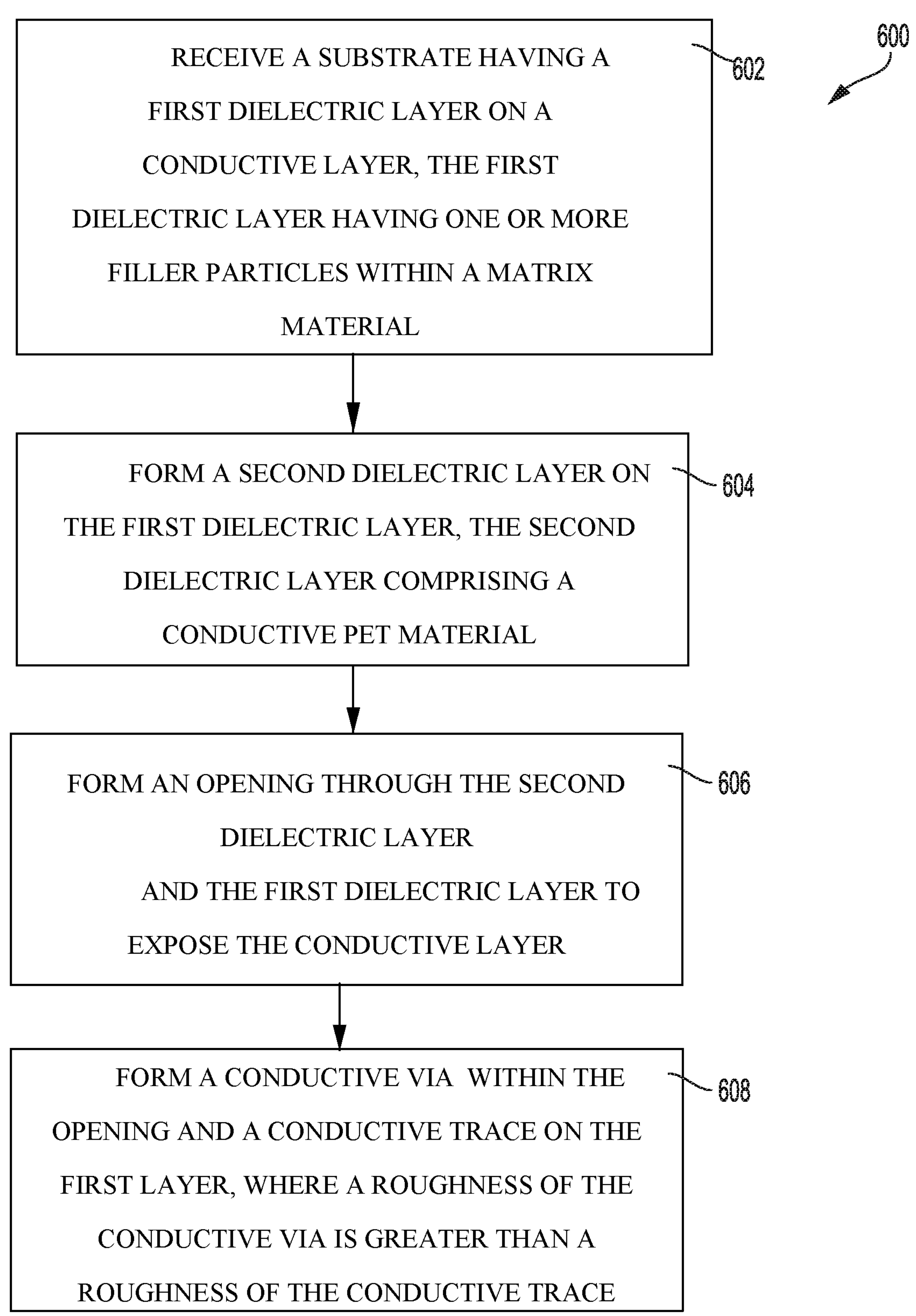
FIG. 6 illustrates a flow chart of a process for the fabrication of IC package structures having bi-layer build up materials, in accordance with some embodiments.

FIG. 6 is a flow chart of a process 600 of fabricating a microelectronic die package structure according to some embodiments. For example, process 600 may be used to fabricate any of the microelectronic IC package structures of FIGS. 3A-3K.

As set forth in block 602, a substrate is received having a first dielectric layer on a conductive layer, the first dielectric layer having one or more filler particles within a matrix material. The matrix material may comprise an organic dielectric material, such as PBO or a BCB material, in some embodiments.

As set forth in block 604, a second dielectric layer may be formed on the first dielectric layer, the second dielectric layer comprising a conductive PET material. In an embodiment, the conductive PET material may comprise a resistivity of less than about $10^{12}$ ohms. The PET material enables the use of a dry etch process flow since it is not susceptible to degradation during plasma processing, and in addition maintains a low roughness surface upon which to form a conductive trace. The conductive PET material also improves chucking capability, since the conductive material aids in the stabilization of a wafer on the plasma tool platform.

As set forth in block 606, an opening is formed through the second dielectric layer and the first dielectric layer to expose the conductive layer. In an embodiment, the opening may comprise a via opening. The PET material acts as an etch stop during the subsequent de-smear dry etch, thus ensuring that the surface of the first dielectric layer will remain relatively smooth. The PET layer is removed prior to electroless formation of the conductive material within the opening. As set forth in block 608, a conductive material, such as copper for example, may be formed in the via using electroless formation processing, as is known in the art. A conductive trace may be formed on the via as well as on a portion of the first layer adjacent the via. The trace material may comprise a lower degree of roughness due to the presence of the PET layer during etch processing. In an embodiment, the PET layer may be formed as a third layer as described in FIG. 3H.

FIG. 7 is a flow chart of a process 700 of fabricating a microelectronic die package structure according to some embodiments. For example, process 700 may be used to fabricate any of the microelectronic IC package structures of FIGS. 4A-4D.

As set forth in block 702, a substrate is received having a stress relief layer on a conductive feature, and a first dielectric layer on the stress relief layer, the first dielectric layer having one or more filler particles within a matrix material on the first dielectric layer, first dielectric layer on a conductive layer, The matrix material may comprise an organic dielectric material, such as PBO or a BCB material, in some embodiments. The stress relief layer may comprise an organic film in an embodiment. In an embodiment, stress relief layer can be a dielectric adhesive or dielectric adhesion layer. In an embodiment, the stress relief layer may comprise an epoxy, polyimide, maleimide, or other material as an organic stress buffer dielectric material.

As set forth in block 704, a second dielectric layer may be formed on the first dielectric layer, the second dielectric layer comprising the matrix material or a second material, and where the filler particles are substantially absent from the second dielectric layer.

Figure 8:
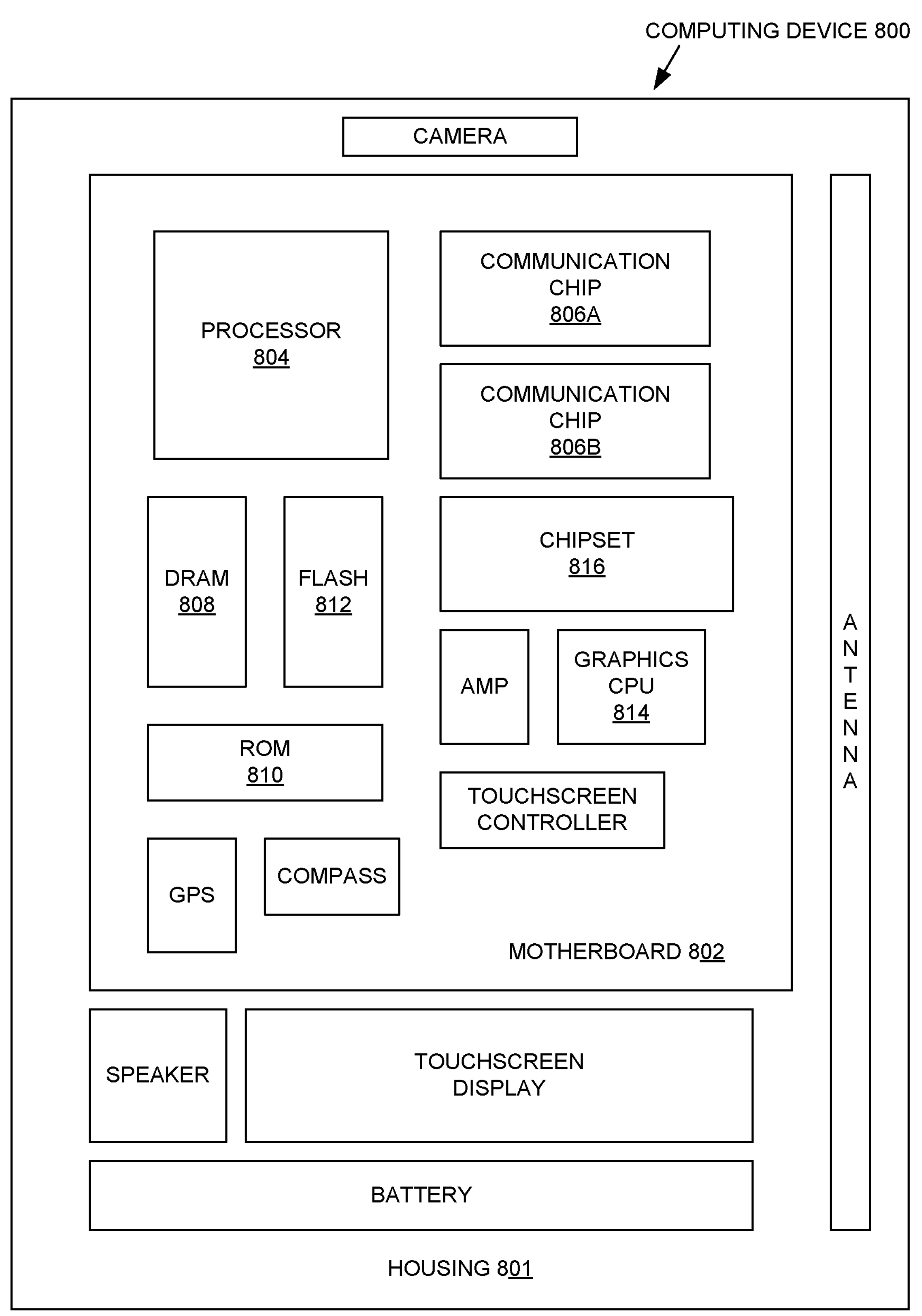
FIG. 8 is a functional block diagram of an electronic computing device, in accordance with some embodiments of the present disclosure.

As set forth in block 706 an opening is formed through the second dielectric layer, the first dielectric layer, and the stress relief layer and the first dielectric layer to expose the conductive layer. As set forth in block 708, a conductive material, such as copper for example, may be formed in the via using electroless formation processing, as is known in the art. A conductive trace may be formed on the via as well as on a portion of the second layer adjacent the via. The trace material may comprise a lower degree of roughness due to the presence of the second layer. Subsequent to filling the opening with the conductive material, the stress relief layer is on the trace conductive features of the IC package structure. The second layer prevents filler material from being exposed during the formation of the conductive trace, and thus reduces the amount of roughness of the conductive trace, which improves device performance FIG. 8 illustrates an electronic or computing device 800 in accordance with one or more implementations of the present description. The computing device 800 may include a housing 801 having a board 502 disposed therein. The computing device 800 may include a number of integrated circuit components, including but not limited to a processor 804, at least one communication chip 806A, 806B, volatile memory 808 (e.g., DRAM), non-volatile memory 810 (e.g., ROM), flash memory 812, a graphics processor or CPU 814, a digital signal processor (not shown), a crypto processor (not shown), a chipset 816, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 802. In some implementations, at least one of the integrated circuit components may be a part of the processor 804.

The communication chip enables wireless communications for the transfer of data to and from the computing device. The term “wireless” and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an electronic substrate having a die on a first dielectric layer of a substrate, the first layer comprising a filler material within a matrix material. A second layer comprising the matrix material or a material different from the matrix material, is on the first layer, wherein the second layer is substantially free of the filler material.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It is understood that the subject matter of the present description is not necessarily limited to specific applications illustrated in FIGS. 1-8. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein a first example is an integrated circuit (IC) package structure, comprising a first layer over a substrate, the first layer comprising a matrix material and a filler material within the matrix material. A second layer is on the first layer, the second layer comprising the matrix material or a second material, wherein the filler material is substantially absent from the second layer, and a conductive feature, wherein a first portion of the conductive feature is on the second layer and a second portion of the conductive feature is on a sidewall of the first layer.

In second examples, the first example includes wherein a thickness of the second layer is between about 500 nm and 1.5 microns.

In third examples, for any of the first examples wherein the filler material comprises a plurality of silica particles.

In fourth examples, for any of the first examples wherein the second layer comprises an organic polymer material.

In fifth examples, for any of the first examples wherein the second layer comprises a polyethylene teraphthalate (PET) layer.

In sixth examples, for any of the first examples wherein the first portion of the conductive feature is a trace, and the second portion is a via, and wherein the second layer is in contact with one or more particles of the filler material.

In seventh examples, for any of the sixth examples wherein the trace comprises copper, wherein a surface roughness of the copper trace is less than about 100 nm.

In eighth examples, for any of the sixth examples wherein the via comprises copper, wherein a surface roughness of the copper via is greater than a roughness of the copper trace.

A ninth example, is a microelectronic package structure, comprising a first layer over a substrate, the first layer comprising a matrix material and a filler material within the matrix material, a second layer on the first layer, the second layer comprising the matrix material or a material different from the matrix material, wherein the second layer is substantially free of the filler material, a conductive feature, wherein a portion of the conductive feature is on the second layer, a die coupled to the conductive feature and on the first layer, and a power supply coupled to the die.

In tenth example for any of the ninth examples wherein the first layer comprises a first build up layer, and an additional build up layer is on the first build up layer.

In eleventh examples for any of the tenth examples wherein the second layer comprises a first second layer, and an additional second layer is between the first build up layer and the additional build up layer.

In twelfth examples, for any of the tenth examples wherein the portion of the conductive feature on the second layer comprises a trace, and a second portion of the conductive feature comprises a via.

In thirteenth examples, for any of the ninth examples wherein the second layer comprises one or more of an epoxy phenol-based polyimide or a benzocyclobutene (BCB) material.

In fourteenth examples, for any of the ninth examples wherein a layer comprising an epoxy, a polyimide or a maleimide, or combinations thereof is on a first side of the conductive feature, on a side opposite of the second layer.

In fifteenth examples, for any of the tenth examples, further comprising a board on a first side of the build up layer, wherein the die is over a second side of the build up layer, and wherein the die is electrically coupled to the board.

In sixteenth examples, a method of forming a package structure, comprising: receiving a substrate comprising: a conductive layer; and a first dielectric layer on the conductive layer, wherein the first dielectric layer comprises filler particles within a matrix material; forming a second dielectric layer on the first dielectric layer, the second dielectric layer comprising the matrix material or a second material, and wherein the filler material is substantially absent from the second layer; and forming an opening through the first dielectric layer and the second dielectric layer, exposing the conductive layer.

In seventeenth examples, for any of the sixteenth examples wherein the second layer comprises a resistivity of below about $10^{12}$ ohms.

In eighteenth examples, for any of the sixteenth examples wherein a thickness of the second layer is between about 500 nm and 1.5 microns.

In nineteenth examples for any of the sixteenth examples wherein the second layer comprises a polyethylene teraphthalate (PET) layer.

In twentieth examples for any of the sixteenth examples a copper via is formed within the opening and a copper trace is formed on the second layer, where a roughness of the copper via is greater than a roughness of the copper trace.

It will be recognized that principles of the disclosure are not limited to the embodiments so described but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An integrated circuit (IC) package structure, comprising:

a first layer over a substrate, the first layer comprising a matrix material and a filler material within the matrix material;

a second layer on the first layer, the second layer comprising the matrix material or a second material, wherein the filler material is substantially absent from the second layer; and a conductive feature, wherein a first portion of the conductive feature is directly on the second layer and a second portion of the conductive feature is directly on a sidewall of the first layer.

2. The IC package structure of claim 1, wherein a thickness of the second layer is between about 500 nm and 1.5 microns.

3. The IC package structure of claim 1, wherein the filler material comprises a plurality of silica particles.

4. The IC package structure of claim 1, wherein the second layer comprises an organic polymer material.

5. The IC package structure of claim 1, wherein the second layer comprises a polyethylene teraphthalate (PET) layer.

6. The IC package structure of claim 1, wherein the first portion of the conductive feature is a trace, and the second portion is a via, and wherein the second layer is in contact with one or more particles of the filler material.

7. The IC package structure of claim 6, wherein the trace comprises copper, wherein a surface roughness of the copper trace is less than about 1100 nm.

8. The IC package structure of claim 6, wherein the via comprises copper, wherein a surface roughness of the copper via is greater than a roughness of the copper trace.

9. A microelectronic package structure, comprising:

a first layer over a substrate, the first layer comprising a matrix material and a filler material within the matrix material;

a second layer on the first layer, the second layer comprising the matrix material or a material different from the matrix material, wherein the second layer is substantially free of the filler material;

a conductive feature, wherein a portion of the conductive feature is directly on the first layer;

a die coupled to the conductive feature and on the first layer; and a power supply coupled to the die.

10. The package structure of claim 9, wherein the first layer comprises a first build up layer, and an additional build up layer is on the first build up layer.

11. The package structure of claim 10, wherein the second layer comprises a first second layer, and an additional second layer is between the first build up layer and the additional build up layer.

12. The package structure of claim 10, wherein the portion of the conductive feature on the second layer comprises a trace, and a second portion of the conductive feature comprises a via.

13. The package structure of claim 10, further comprising a board on a first side of the build up layer, wherein the die is over a second side of the build up layer, and wherein the die is electrically coupled to the board.

14. The package structure of claim 9, wherein the second layer comprises one or more of an epoxy phenol-based polyimide or a benzocyclobutene (BCB) material.

15. The package structure of claim 9, wherein a layer comprising an epoxy, a polyimide or a maleimide, or combinations thereof is on a first side of the conductive feature, on a side opposite of the second layer.

* * * * *